(12) United States Patent
Rostamzadeh et al.

(10) Patent No.: US 8,089,266 B2
(45) Date of Patent: Jan. 3, 2012

(54) MEASURING INDUCED CURRENTS ON A CAN BUS

(75) Inventors: Cyrous Rostamzadeh, Bloomfield, MI (US); Sergio A. Pignari, Incisa Scapaccino (IT)

(73) Assignee: Robert Bosch GmbH, Stuttgart (DE)

( * ) Notice: Subject to any disclaimer, the term of this patent is extended or adjusted under 35 U.S.C. 154(b) by 659 days.

(21) Appl. No.: 12/187,075

(22) Filed: Aug. 6, 2008

(65) Prior Publication Data

US 2010/0033165 A1 Feb. 11, 2010

(51) Int. Cl.
*G01R 15/18* (2006.01)
(52) U.S. Cl. ........................................... 324/127
(58) Field of Classification Search .................. None
See application file for complete search history.

(56) References Cited

U.S. PATENT DOCUMENTS

| | | | |
|---|---|---|---|
| 4,973,911 A | 11/1990 | Marshall | |
| 5,017,878 A | 5/1991 | Nave | |
| 5,121,045 A | 6/1992 | Caserta et al. | |
| 5,414,348 A | 5/1995 | Niemann | |
| 5,528,205 A | 6/1996 | Wong | |
| 5,592,510 A | 1/1997 | Van Brunt et al. | |
| 6,326,817 B1 | 12/2001 | Boezen et al. | |
| 6,459,739 B1 | 10/2002 | Vitenberg | |
| 6,636,107 B2 | 10/2003 | Pelly | |
| 6,819,076 B2 | 11/2004 | Takahashi | |
| 2004/0085157 A1 | 5/2004 | Richardson | |
| 2006/0160511 A1 | 7/2006 | Trichy et al. | |
| 2008/0037298 A1 | 2/2008 | Lafontaine | |

OTHER PUBLICATIONS

J. Lepkowski, B. Wolfe and W. Lepkowski, "EMI/ESD Solutions for the CAN Network", 2005 IEEE.
Dallas Semiconductor MAXIM. "Understanding Common-Mode Signals." [Online] May 21, 2003. <http://www.maxim-ic.com/an2045>.
Linear Technology, "Wide Dynamic Range RF/IF Log Detector".—LT5537, 2005.
R.T. McLaughlin, "The Immunity to RF Interference of a CAN System", Advanced Technology Centre, University of Warwick, at least as early as Aug. 6, 2007.
S. Hasnaoui, A. Bouallegue, "Influence of Multipath Fading on the Implementation of a Radio Sensor as an Isolated Station on a Web CAN—Based Control Systems", 1999 IEEE.
Mini-Circuits, "RF Transformers", Last Updated Sep. 8, 1999.
Mini-Circuits, "RF Transformers Wideband", 10 kHz to 1400 MHz, at least as early as Aug. 6, 2007.
Ting Guo, Dan Y. Chen, and Fred C. Lee, "Separation of the Common-Mode-and Differential-Mode-Conducted EMI Noise", IEEE Transactions on Power Electronics, vol. 11, No. 3, May 1996.

*Primary Examiner* — Roberto Velez
(74) *Attorney, Agent, or Firm* — Michael Best & Friedrich LLP

(57) ABSTRACT

A device for measuring currents induced in a CAN bus harness. In some embodiments, the device includes a first termination node, a second termination node, a current separator, a detection circuit, and a power source circuit. The current separator circuit has an RF transformer connected to the first termination node and separates a common mode RF current and a differential mode RF current of an RF current signal. The detection circuit is connected to the current separator circuit and receives at least one of the common mode RF current and the differential mode RF current from the separator circuit. The detection circuit also converts the common mode RF current and differential mode RF current to an non-RF output signal. The power source circuit provides power to the detection circuit.

20 Claims, 6 Drawing Sheets

MEASURING INDUCED CURRENTS ON A CAN BUS

FIELD

The present invention relates to a controller area network ("CAN") bus. More specifically, the present invention relates to measuring induced radio frequency ("RF") currents on a CAN bus caused by electromagnetic interference ("EMI").

BACKGROUND

A CAN bus is a serial bus system that supports distributed control systems. Initially introduced in 1986 by Robert Bosch GmbH, Germany, CAN has been standardized by several automotive standards setting bodies, such as the International Standardization Organization (ISO), and by the Society of Automotive Engineers (SAE). While CAN is often utilized in the automotive sector, CAN bus systems have recently been applied in the space, rail, and building-automation environments.

When implemented in a real-world environment (e.g., a CAN bus installed in a vehicle), a CAN bus may be subjected to electromagnetic waves from a variety of sources (e.g., broadcast radio and TV, high-power transmission lines and other electrical power distribution systems, cellular telephone equipment, etc.). The noise created by these sources can interfere with the operation of the CAN bus and the components connected to the bus.

SUMMARY

Some configurations of a CAN bus are more susceptible to EMI than others. Accordingly, it is useful to test a CAN bus implementation before the CAN bus (and associated devices) are put in use. Such tests can reveal the effects of EMI on the CAN bus tested and whether the CAN bus is sufficiently immune from such interference to be used in the desired application (e.g., in a car, in a train, in a building, etc.). In other words, testing allows a CAN bus to be validated prior to being used or approved for use in a particular vehicle, building, or other application.

Standards have been developed for CAN testing and validation (e.g., Standard DC-11224). For example, some original equipment manufacturers ("OEM") have determined that a CAN bus must be able to withstand being subjected to an EMI intensity of 200 V/m from 1 MHz to 400 MHz. However, when subjecting the CAN bus to EMI during testing, the measurement of induced currents is difficult. For example, traditional RF current probes may not be able to accurately measure the induced currents, thereby providing inflated induced current measurements. Inflated measurements leads to the implementation unnecessary, costly, and excessive protection components for the CAN bus and harness. Accordingly, an accurate device and method of measuring induced currents on a CAN bus during testing and validation can aid in producing a cost effective CAN bus, while still meeting applicable design standards.

In one embodiment, the invention provides a device for measuring currents induced in a CAN bus harness having a first termination node and a second termination node. The device includes a current separator circuit, a detection circuit, a power source circuit, an electromagnetic shield, a first load, and a second load. The current separator circuit has an RF transformer that is connected to the first termination node of the bus harness. The RF transformer includes a primary with a center tap and a secondary. The detection circuit is connected to the current separator circuit, and has a log-linear RF/IF integrated circuit. The power source circuit is connected to the detection circuit. The electromagnetic shield encloses the detection circuit and the power source circuit. The first load is connected to the center tap. The second load is connected to the secondary. The detection circuit is connected to the first load and to the second load, and measures both common-mode and differential-mode currents in the CAN bus harness.

In another embodiment, the invention provides a device for measuring currents induced in a CAN bus harness having a first termination node and a second termination node. The device includes a current separator circuit, a detection circuit, and a power source circuit. The current separator circuit has an RF transformer connected to the first termination node and separates a common mode RF current and a differential mode RF current of an RF current signal. The detection circuit is connected to the current separator circuit and receives at least one of the common mode RF current and the differential mode RF current from the separator circuit. The detection circuit also converts the common mode RF current and differential mode RF current to an non-RF output signal. The power source circuit provides power to the detection circuit.

In another embodiment, the invention provides a method of measuring currents induced in a CAN bus harness having a first termination node and a second termination node. The method includes coupling a separator circuit to the first termination node. The separator circuit separates a common mode current and a differential mode current of an RF current. The method also includes inducing a RF current onto the CAN bus harness, and transmitting, by the separator circuit, at least one of the common mode current and the differential mode current to a RF detection device. The method also includes receiving, by the RF detection device, at least one of the common mode current and the differential mode current, and converting at least one of the common mode current and the differential mode current to an output signal.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

Figure 1:
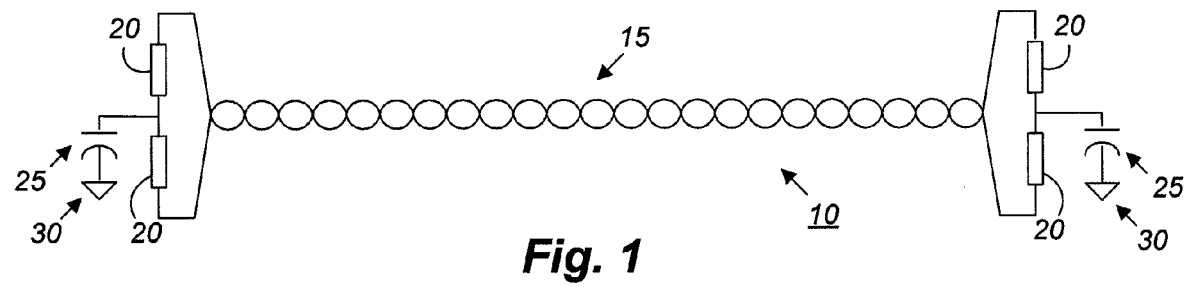
FIG. 1 is a schematic of an exemplary CAN bus having a twisted wire pair, according to an embodiment of the invention.

FIG. 1 illustrates an exemplary CAN bus 10 that includes a number of conductors 11 and 12. The conductors (which might be cables) are wound together in a twisted-wire-pair ("TWP") configuration, which is referred to hereafter simply as a TWP 15. The CAN bus 10 also has (or is modeled to have) a plurality of termination load elements 20, and two capacitors 25 connected to a ground plane 30. A CAN bus harness includes the TWP 15 and plugs, sockets, and other connectors or terminals that are used to connect various components to the bus. For example, when the CAN bus 10 is utilized in an automobile, it provides a means of communication for a variety of different control modules (e.g., an engine control unit ("ECU") module, a transmission control module, an airbag module, an antilock braking module, a cruise control module, etc.) within the automobile. These devices have one or more connectors that are plugged into the bus or otherwise connected to plugs or connectors of the bus.

The termination load elements 20 are provided to match the characteristic impedance of the TWP 15. In some embodiments, there is a single termination load element coupled to each end of the TWP 15 (e.g., a termination load element of approximately 124 ohms to match the impedance of the TWP 15). In the embodiment shown in FIG. 1, the termination load elements 20 are split, such that each end of each wire of the TWP 15 has a termination load element 20 coupled to it. Each of the termination load elements 20 is configured to match half of the characteristic impedance of the TWP 15. For example, a TWP 15 having a characteristic impedance of 124 ohms requires four, split-termination load elements 20 having a resistance of approximately 62 ohms each. Using split-termination load elements 20 at the ends of the TWP 15 helps to improve the electromagnetic compatibility ("EMC") characteristics of the CAN bus 10. Between the termination load elements 20 at each end of the TWP 15, a center tap is connected to one of the capacitors 25, which is connected to ground.

When implemented in a real-world environment (e.g., a CAN bus installed in a vehicle), the CAN bus may be subjected to electromagnetic waves from a variety of sources. While the TWP 15 is designed to be resistant to electromagnetic interference, impinging waves may nonetheless interfere with the proper operation of electronic modules connected to the CAN bus 10. EMI generally includes a common mode current component and a differential mode current component. For example, common mode or asymmetric currents are noise currents within each of the wires of the TWP 15 that are equal in magnitude and travel in the same direction. Differential mode or symmetric currents are noise currents within each wire of the TWP 15 that are equal in magnitude, but that are oppositely directed.

Subjecting control modules connected to the TWP 15 to common mode and differential mode currents can have an adverse effect on the modules, often leading to improper operation and eventual failure. To avoid this result, the CAN bus 10, as well as any control modules connected to the CAN bus 10, must be tested and validated prior to being approved for implementation. Development of procedures and equipment to verification the immunity or resistance of a bus to EMI is helpful to quantitatively characterize the ability of the CAN bus to operate in noisy environments (i.e., environments in which electromagnetic radiation is prevalent). Experimental verification can also aid in assessing the maximum performance of CAN bus 10.

Figure 2:
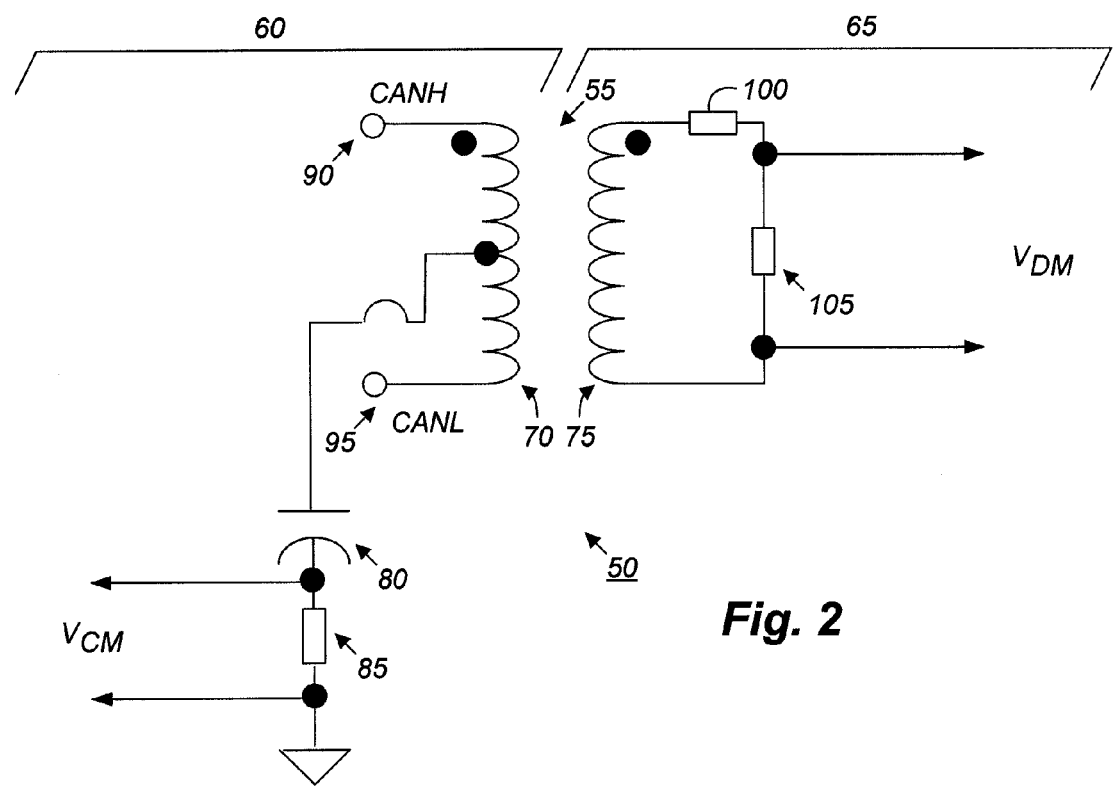
FIG. 2 is a schematic of an exemplary separator circuit, according to an embodiment of the invention.

FIG. 2 illustrates an exemplary separator circuit 50, having a transformer 55, a common mode portion 60, and a differential mode portion 65. The separator circuit 50 is used to separate common mode and differential mode currents that are present on a CAN bus.

In the embodiment shown in FIG. 2, the transformer 55 is an in-phase, RF transformer having a center-tapped primary winding or primary 70 and a secondary winding or secondary 75. In some embodiments, the transformer 55 has a bandwidth of 0.4-450 MHz and an impedance ratio (secondary to primary) of 2. While other transformers 55 may be used, one suitable transformer is a Mini-Circuit ADT2-1T RF transformer (Mini-Circuit, New York 11235).

The primary 70 of the transformer 55 is part of the common mode portion 60 of the separator circuit 50. The common mode portion 60 of the separator circuit 50 also includes a capacitor 80 and a resistor 85. The capacitor 80 is connected to the center tap of the transformer 55 and the resistor 85. The resistor 85 provides a point for sampling or measuring common mode current in the CAN bus 10. The resistor 85 is sized to match the characteristic impedance of the CAN bus 10. In one embodiment, the capacitor 80 has a capacitance of 100 nF, and the resistor 85 has a resistance of 50 ohms. However, the capacitor 80 and the resistor 85 may be configured differently according to the configuration of the separator circuit 50 and the CAN bus 10.

The secondary 75 of the transformer 55 is included in the differential mode portion 65 of the separator circuit 50. The differential mode portion 65 of the separator circuit 50 also includes a first resistor 100, and a second resistor 105. The first resistor 100 and the second resistor 105 are connected in series with the secondary 75. The first resistor 100 and the second resistor 105 are sized to match the characteristic impedance of the CAN bus 10. Also, the second resistor 105 provides a point for sampling or measuring the differential mode current. In one embodiment, the first resistor 100 has a resistance of 10 ohms, and the second resistor 105 has a resistance of 50 ohms. The first resistor 100 and the second resistor 105 may be configured differently according to the configuration of the separator circuit 50 and the CAN bus 10.

When a CAN bus (such as the CAN bus 10) is tested, the separator circuit 50 is connected to the CAN bus through a first terminal 90 and a second terminal 95 (which are connected to primary 70). For example, terminal 90 is connected to one of the wires of the TWP 15 (i.e., the high-voltage line), and terminal 95 is connected to the other wire of the TWP 15 (i.e., the low-voltage line). Accordingly, a signal being transmitted through the TWP 15 is also transmitted through the primary winding 70. The primary winding 70 is center tapped, such that the signal on the primary winding 70 is transmitted to the other elements of the common mode portion 60. Additionally, an electromagnetic relationship between the primary 70 and the secondary 75 (as known in the art), allows a signal of the primary 70 to be transferred to the secondary 75 and the first resistor 100 and second resistor 105.

When the CAN bus 10 is energized, a common mode signal, which represents the magnitude of a common mode current on the CAN bus 10, is sampled or measured at the resistor 85 of the common mode portion 60. Additionally, a differential mode signal, which represents the magnitude of a differential mode current on the CAN bus 10, is sampled or measured at the second resistor 105 of the differential mode portion 65. As described with respect to FIGS. 3 and 4, the common mode signal from the common mode portion 60 and the differential mode signal from the differential mode portion 65 provide input signals for other integrated circuits, such as a log-linear RF/IF detector circuit.

Figure 3:
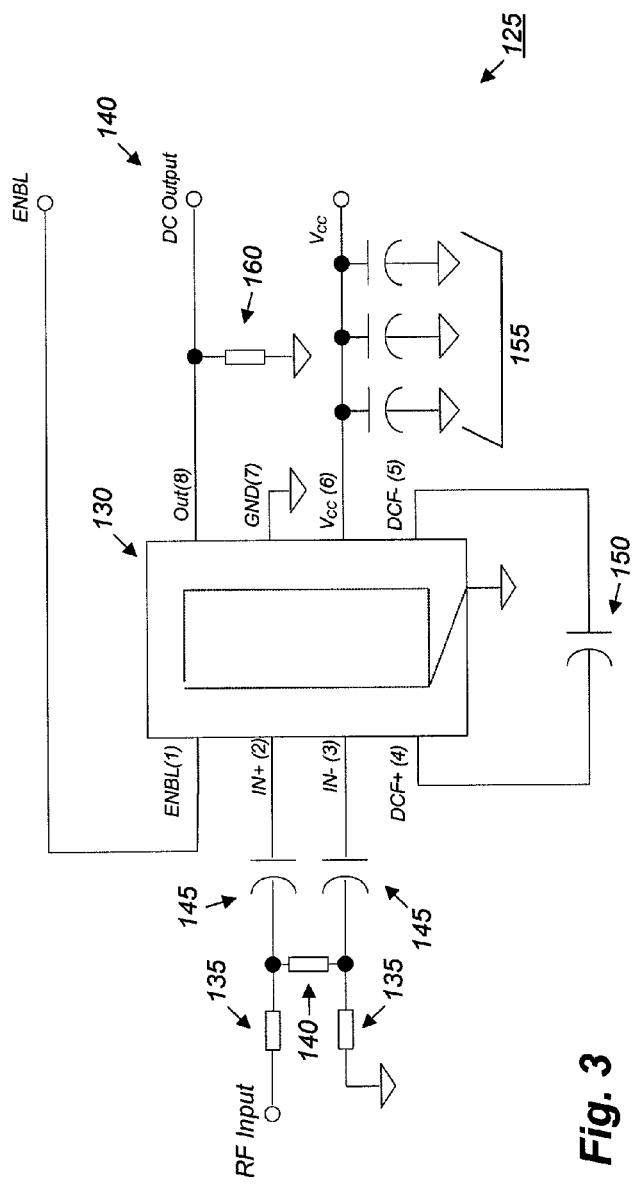
FIG. 3 is a schematic of an exemplary RF detection circuit, according to an embodiment of the invention.

FIG. 3 illustrates an exemplary RF detection circuit 125 having an integrated circuit ("IC") 130 and a plurality of discrete electronic elements or electronics, as described in greater detail below. In one embodiment, the IC 130 includes an enable pin (ENBL), a first input pin (IN+), a second input pin (IN−), a first external filter capacitor pin (DCF+), a second external capacitor pin (DCF−), a power supply pin (Vcc), a ground pin (GND), and an output pin (OUT). A suitable, commercially available integrated circuit is the Wide Dynamic Range RF/IF Log Detector LT5537 integrated circuit, manufactured by Linear Technologies (Milpitas, Calif., 95035), although other integrated circuits may be used.

The IC 130 converts and RF input signal to a non-RF output signal. The input and output signals are correlated by a known, constant value. For example, in one embodiment, an RF input signal is amplified successively by a series of amplifier stages, as well as rectified by detector cells. The output signal of the IC 130 is therefore log-linearly related to the input signal by a known coefficient value, as shown in equation (1) below:

$$V_{dc}^{out} = S(f)[P_{dBm}^{in}(f) - P_0(f)] \quad (1)$$

where $V^{out}$ is the output DC voltage, and $P_{dBm}$ is the input RF power at frequency f in dBm. Additionally, in equation (1), S and $P_0$ represent the slope and intercept values, respectively, which can be obtained by known frequency interpolation data (e.g., interpolation of frequency specific data distributed with the particular RF detector circuit being implemented).

In the embodiment shown in FIG. 3, the RF detection circuit 125 also has discrete electronic components including a pair of 0 ohm resistors 135, a matching resistor 140, and two capacitors 145 connected to the input pins (IN+ and IN−) of the IC 130. The 0 ohm resistors 135 provide short circuit connections between the RF input and the input pins (IN+ and IN−) of the IC 130. The 0 ohm resistors 135 may aid in a manufacturing process if the IC 130 is disposed on a printed circuit board (e.g., as opposed to using jumpers on a printed circuit board). The 0 ohm resistors 135 may also provide flexibility, for example, if the detection circuit 125 is modified for a configuration requiring additional input resistance. The matching resistor 140 provides the impedance necessary to approximately match the characteristic impedance of the IC 130. In one embodiment, the matching resistor 140 has a resistance of approximately 51 ohms. The two capacitors 145 are provided as coupling capacitors or DC blocking capacitors for the input pins (IN+ and IN−) of the IC 130. In one embodiment, the two capacitors 145 have a capacitance of approximately 100 pF.

Additionally, a capacitor 150 is connected between the first external filter capacitor pin (DCF+) and the second external capacitor pin (DCF−). The capacitor 150 provides an external filter for the IC 130. In one embodiment, the capacitor 150 has a capacitance of 33 nF. A bank of capacitors 155 is also coupled to the Vcc pin of the IC 130. The bank of capacitors 155 provides input power filtering. In one embodiment, the capacitors of the capacitor bank 155 have capacitances of 1000 pF, 1 µF, and 10 µF, from left to right, respectively. A resistor 160 is coupled to the output pin (OUT) of the IC 130. The resistor 160 increases the total load resistance of the output pin or terminal (OUT) and provides an external pull-down resistance that reduces ripple voltages. In one embodiment, the resistor 160 has a resistance of approximately 33 ohms.

The RF detection circuit 125 converts an RF input signal to an output signal (e.g., a direct current ("DC") output signal). The output signal can used for the experimental characterization of the immunity of a general CAN bus system. For example, in some embodiments, the output signal is transmitted from the RF detection circuit 125 to output monitoring components (e.g., a voltmeter, an oscilloscope, etc.). The output monitoring components allow a user to interpret the output signal, and draw conclusions regarding the EMI immunity characteristics of the CAN bus coupled to the RF detection circuit 125.

Figure 4:
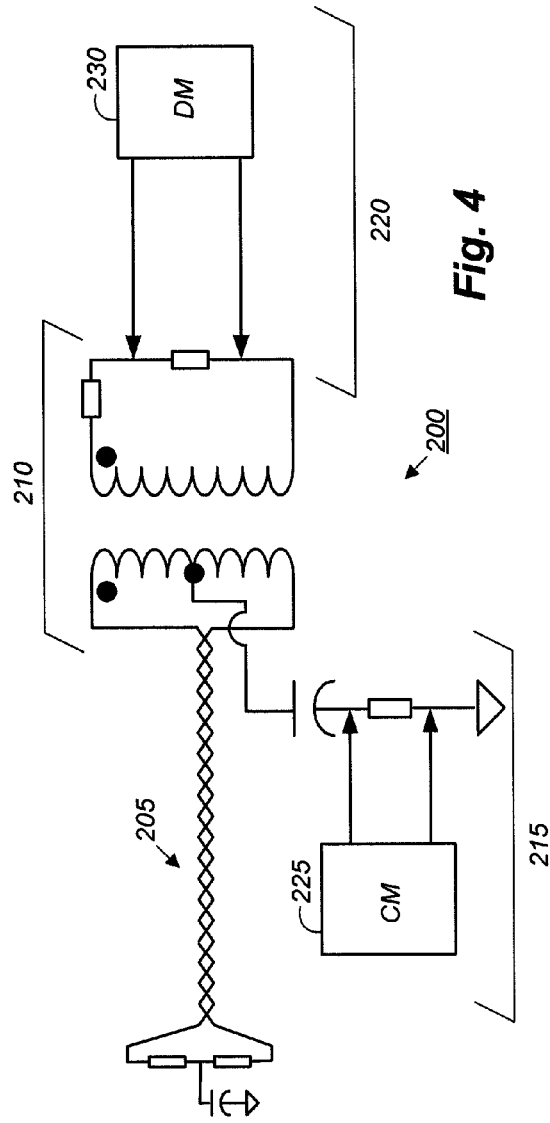
FIG. 4 is a schematic of an exemplary circuit for measuring RF current in a CAN bus, according to an embodiment of the invention.

FIG. 4 illustrates an exemplary RF detection system 200 for measuring RF currents on a CAN bus 205. The detection system 200 includes a separator circuit 210 having a center-tapped primary 212 and a secondary 214, a common mode sensing portion 215, and a differential mode sensing portion 220. In some embodiments, the separator circuit 210 is similar or the same as the separator circuit 50 (shown in FIG. 2), and the common mode portion 215 and the differential mode portion 220 incorporates the RF detection circuit 125 (shown in FIG. 3).

The separator circuit 210 receives an RF current signal from the CAN bus 205 and separates a common mode current and a differential mode current from the RF current signal, if such currents are present. The common mode current is transmitted to the common mode portion 215, where common mode detection electronics 225 manipulate or convert the RF current signal into an output signal that can be utilized by a variety of measurement and display devices (e.g., an oscilloscope, a voltmeter, a computer, etc.). Similarly, the differential mode current is transmitted to the differential mode portion 220, where differential mode detection electronics 230 convert and/or manipulate the RF current signal into a signal that can be utilized by similar display and measurement devices.

The RF detection system 200 provides separation and processing of common mode and differential mode signals, which can aid a user in characterizing properties of the CAN bus 205. In some embodiments, the common mode electronics 225 and the differential mode electronics 230 are embodied in a single IC (e.g., the RF detection circuit 125 shown in FIG. 3). This single IC is either connected to the center-tapped primary 212 of the separator circuit 210 or the secondary 214 of the separator circuit 210, depending on whether a user wishes to monitor a common mode output or a differential mode output, respectively. For example, if a user wishes to monitor a common mode current, the IC is connected to the primary 212 of the separator circuit 210 and disconnected from the secondary 214 of the separator circuit 210. Conversely, if the user wishes to monitor a differential mode current, the IC is connected to the secondary 214 of the separator circuit 210 and disconnected from the primary 212 of the separator circuit 210.

In other embodiments, the common mode electronics 225 and the differential mode electronics 230 are embodied by two separate ICs, with one IC connected to the primary 212 and one IC connected to the secondary 214. In this way, both the common mode current and the differential mode current can be simultaneously processed or monitored by a user.

Figure 5:
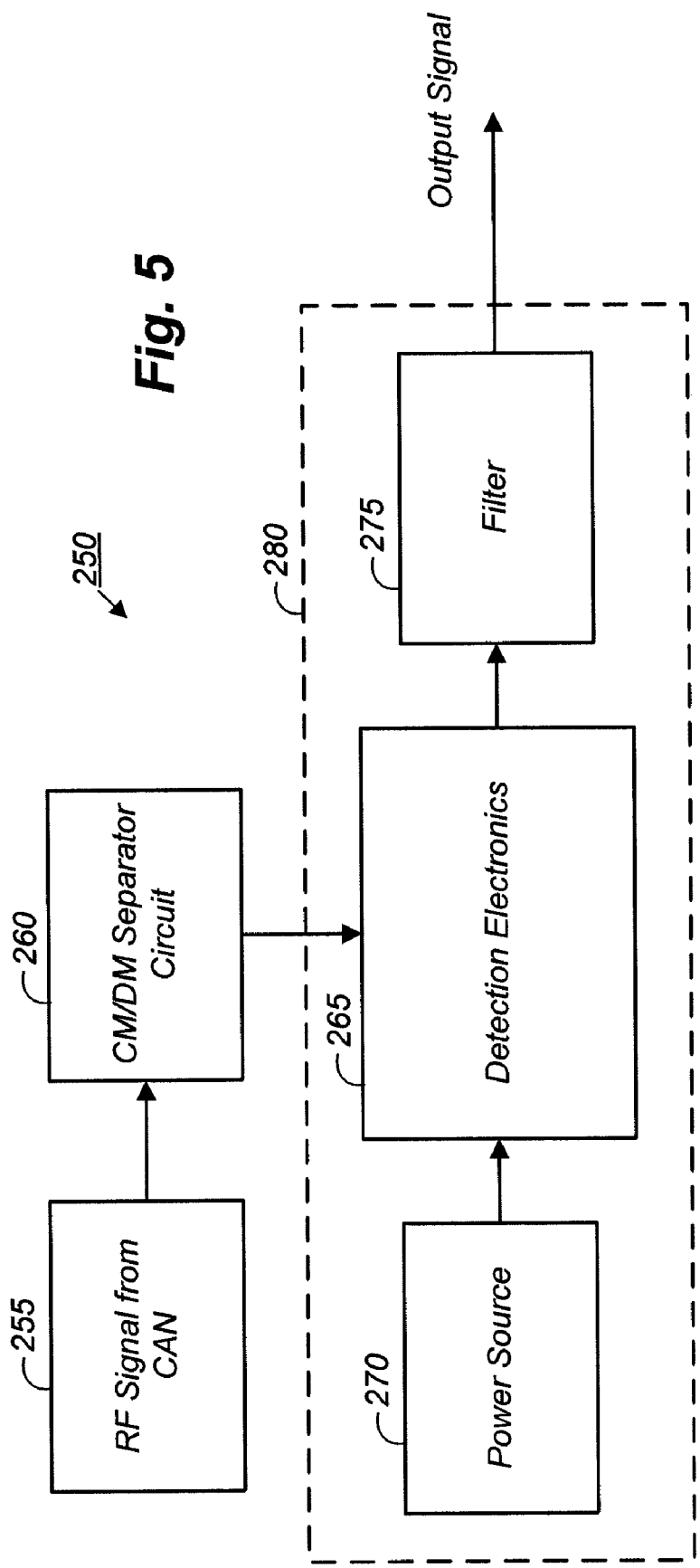
FIG. 5 is a block diagram of an exemplary system for measuring RF current in a CAN bus, according to an embodiment of the invention.

FIG. 5 is a block diagram representing the relationship of components of an RF detection system 250. The RF detection system 250 receives an RF signal 255 from a CAN bus, and includes a common mode/differential mode current separator circuit 260, RF detection electronics 265, a power source 270, and a filter 275. In the embodiment shown in FIG. 5, the RF detection electronics 265, the power source 270, and the filter 275 are positioned within an enclosure 280.

In some embodiments, the RF signal from the CAN bus 255 is an RF current that is induced on the CAN bus by a component within a CAN testing apparatus. The RF signal from the CAN bus 255 is transmitted to the common mode and differential mode separator circuit 260. In some embodiments the common mode and differential mode separator circuit 260 is configured similar to the separator circuit 50 shown in FIG. 2. The common mode and differential mode separator circuit 260 separates the common mode and differential mode currents from the incoming signal, and provides the separated common mode and differential mode current signals to the detection electronics 265.

The detection electronics 265 receives the separated signals from the separator circuit 260, and converts the RF current to generate a DC output signal. The detection electronics 265 are powered by the power source circuit 270. In some embodiments, the power source circuit 270 is a DC power source. For example, in one embodiment, three 1.5 volt AA batteries provide power to the detection electronics 265. The use of a DC power source, such as batteries, provides enough power to support a wide dynamic range (e.g., 90 dB) for the detection electronics 265 (e.g., −76 dBm to 14 dBm, single ended 50 ohm input). In other embodiments, the power is provided by other sources, for example, a transformer-based AC to DC converter.

The filter 275 receives the signal from the detection electronics 280. In one embodiment, the filter 275 is a bushing style EMI filter (e.g., Tusonix Bushing Style EMI Filter No. 4201-001, Tucson, Ariz.) that is coupled to the side of the enclosure 280 (described below). For example, the filter 275 provides a connection between the detection electronics and an external conductor (e.g., a conductor on which the output signal is transmitted). The filter 275 provides EMI shielding and protection for the detection electronics signal.

As shown in FIG. 5, the enclosure 280 substantially surrounds or encloses the detection electronics 265, power source 270, and the filter 275. The enclosure 280 may include one or more connectors (e.g., SubMiniature version A ("SMA") connectors) for providing connections between components within the enclosure 280 to components outside of the enclosure 280. The enclosure 280 may also incorporate one or more user input devices (e.g., a switch, a pushbutton, etc.) that interact with the detection electronics 265. In some embodiments, the enclosure 280 is made of a metallic or other EMI shielding material, which protects the components within from being disrupted or adversely affected by EMI.

In the embodiment shown in FIG. 5, an RF current signal from the separator circuit 260 (e.g., either the common mode signal or the differential mode signal) is transmitted to the detection electronics 265, and a corresponding single output signal is produced. However, in other embodiments, the separator circuit 260 may transmit both the common mode and the differential mode current signals to the detection electronics 265, thereby simultaneously producing two corresponding output signals. In such an embodiment, the detection electronics 265 may include multiple ICs (e.g., a common mode IC and a differential mode IC) in order to process both signals from the separator circuit 260 concurrently.

Figure 6:
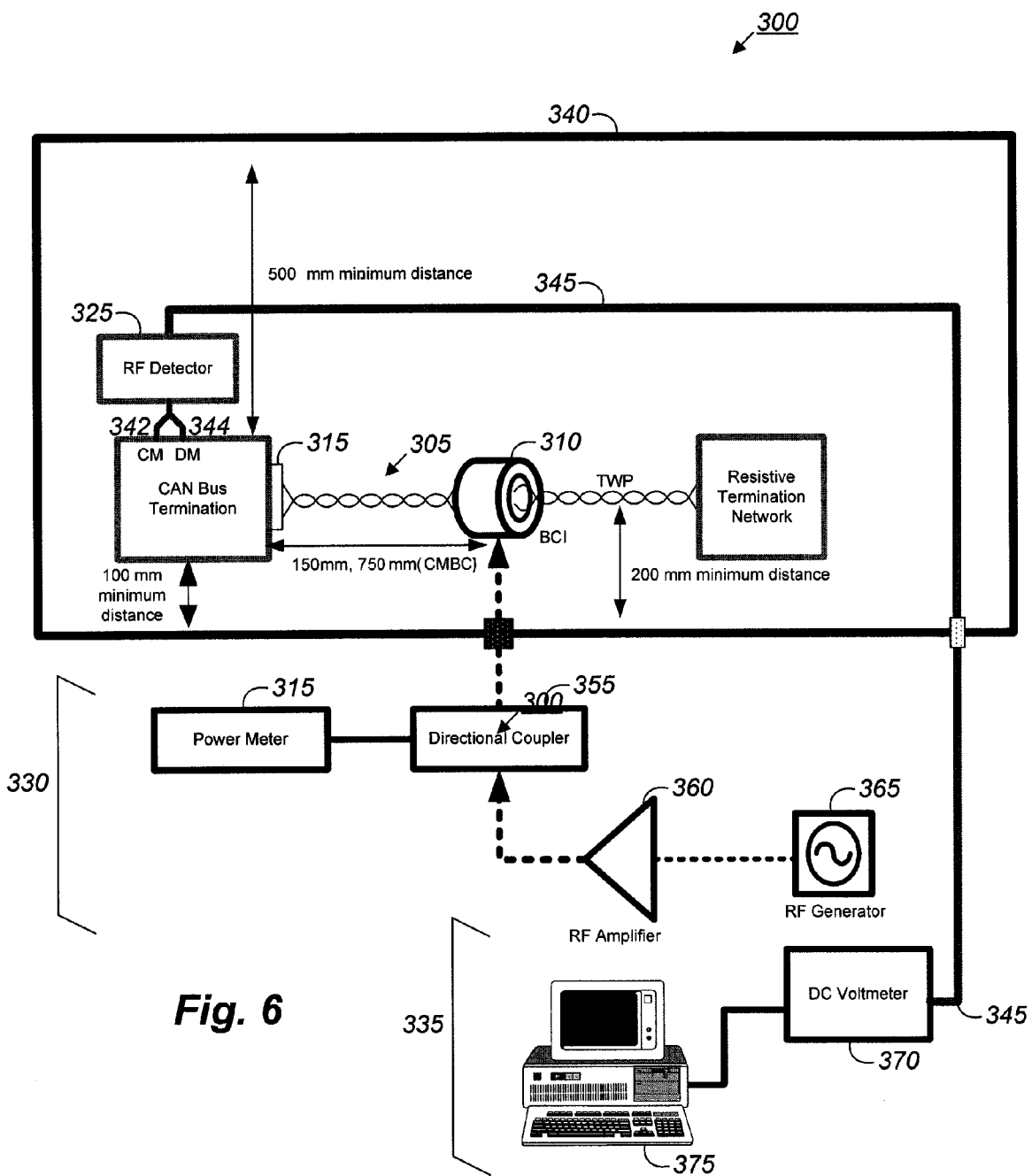
FIG. 6 is a diagram of an exemplary testing apparatus for a CAN bus, according to an embodiment of the invention.

FIG. 6 illustrates an exemplary testing apparatus 300 for a CAN bus 305. The testing apparatus 300 includes a bulk current injection ("BCI") device 310, an attenuator 315, a CAN bus termination node 320, and an RF detector 325. The testing apparatus also includes a plurality of RF signal generating and monitoring components 330, as well as output monitoring components 335. In the embodiment shown in FIG. 6, the CAN bus 305 is tested in an anechoic room 340, thereby eliminating foreign/unintended EMI signals from being introduced.

The BCI device 310 surrounds the CAN bus 305 and introduces RF current generated by the components 330 onto the CAN bus 605. The BCI device 310 can vary the frequency and intensity of the signal induced on the CAN bus 305. For example, in some embodiments, the BCI device 310 is used to vary the frequency of the RF current imposed from 1 MHz to 400 MHz. The BIC device 310 can also be used to vary the amplitude of the RF current imposed by the BCI device 310 from 0 mA to 30 mA. Additionally, the position of the BCI device 310 with respect to the CAN bus 305 may also be varied. For example, the BCI device 310 can be positioned 15 cm to 75 cm from the CAN bus termination node 320.

The attenuator 315 provides attenuation for the signal from the CAN bus 305, without distorting the signal from the CAN bus 305. The CAN bus termination node 320 includes a separator circuit (e.g., the separator circuit 50 shown in FIG. 2) to separate the common mode and differential mode current components from an input RF current. The CAN bus termination node 320 also includes a common mode connector 342 and a differential mode connector 344. The connectors 342, 344 provide separate connection points, thereby allowing a user to connect either the common mode connector 342 or the differential mode connector 344 to the RF detector 325, depending on which signal the user desires to monitor. The RF detector 325, which is coupled to the CAN bus termination node 320 via the connectors 342 and 344, includes circuitry that converts the separated common mode and differential mode RF currents into output signals 345. In some embodiments, the RF detector 325 is configured similar to the detection circuit 125 shown in FIG. 3.

In the embodiment shown in FIG. 6, the RF signal generating and monitoring components include a power meter 350, a directional coupler 355, one or more RF amplifiers 360, and an RF generator 365. Additionally, the output monitoring components 335 include a DC voltmeter 370 and a computer 375.

During testing, an RF current is induced in the CAN bus 305 by the BCI device 310. A user can alter the magnitude and frequency of the signal induced on the CAN bus 305 by manipulating the signal being transmitted by the BCI device 310. The induced signal from the CAN bus 305 is received by the attenuator 315 and transmitted to the CAN bus termination node 320. The induced RF current signal is then received by the RF detector 325, where it is converted from an RF current signal into one or more output signals 345. In some embodiments, the RF detector 325 is a log-linear type conversion circuit, and the resulting output signals 345 are DC signals. The output signals 345 are then transmitted to the output monitoring components 335, which allow a user to interpret the output signals. In this way, a user can draw accurate inferences between the RF signals being induced (by the BCI device 310) and the resulting output signals 345.

Figure 7:
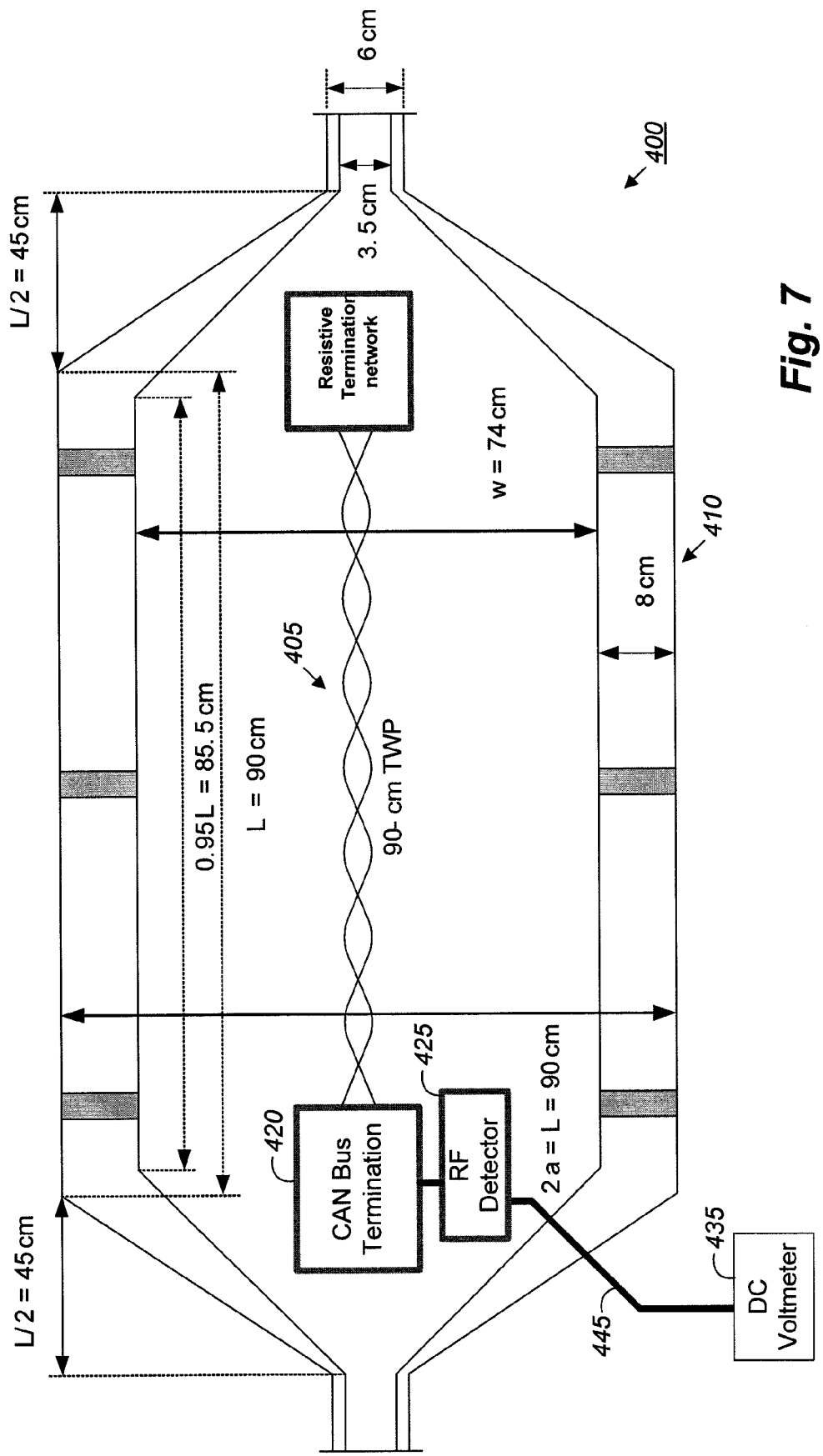
FIG. 7 is another diagram of an exemplary testing apparatus for a CAN bus, according to an embodiment of the invention.

FIG. 7 illustrates another exemplary testing apparatus 400 for a CAN bus 405. In the embodiment shown in FIG. 7, the testing apparatus includes a transverse electromagnetic ("TEM") cell 410, a CAN bus termination node 420, and an RF detector 425. The testing apparatus 400 also includes an output monitoring component 435.

In one embodiment, the TEM cell 410 is a 50 ohm symmetric square TEM cell with a cutoff frequency of 200 MHz. The TEM cell 410 provides EMI protection for the CAN bus 405, the CAN bus termination node 420, and the RF detector 425. The CAN bus termination node 420, the RF detector 425, and the output monitoring component 435 shown in FIG. 7 are similar to, or the same as the like components disclosed with respect to FIG. 6.

During testing, the TEM cell 410 is used to irradiate the CAN bus 405 with a 200 V/m signal, thereby inducing an RF current signal on the CAN bus. The frequency of the 200 V/m signal can be varied from approximately 1 MHz to 200 MHz during testing. The induced RF current signal is transmitted from the CAN bus 405 to the CAN bus termination node 420, which separates the RF current signal (as described with respect to FIG. 6). The RF detector 425 converts the RF current signal into an output signal 445 which is provided to the output monitoring components 435.

Figure 8A:
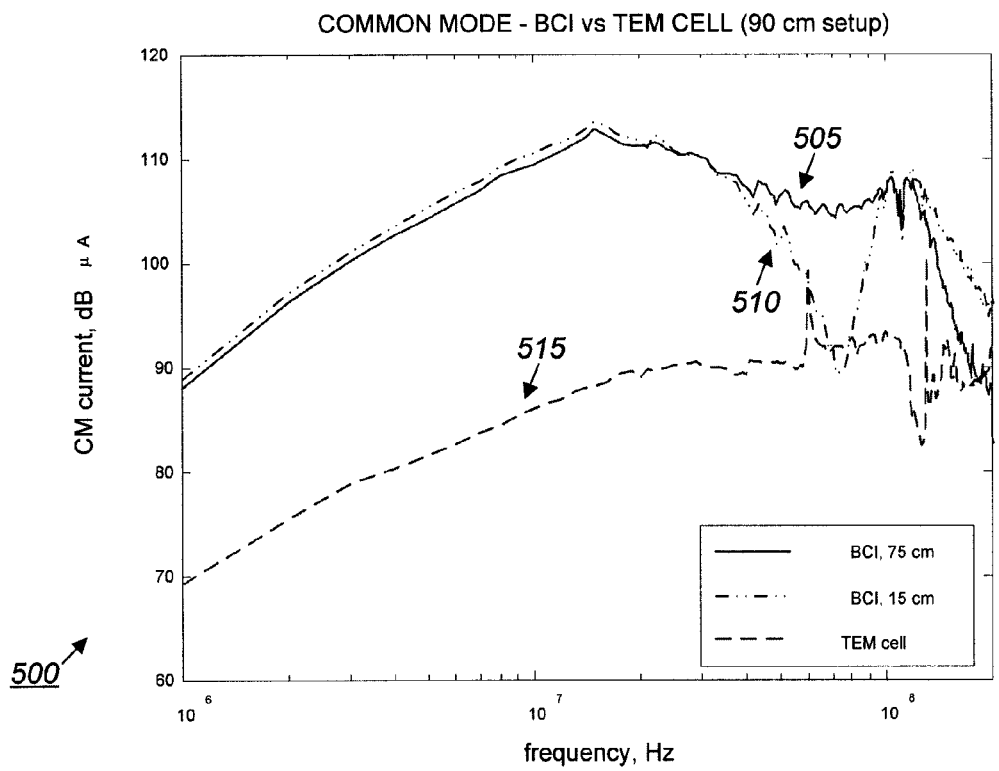
FIG. 8A is an exemplary plot of common mode currents on a CAN bus, according to one embodiment of the invention.
Figure 8B:
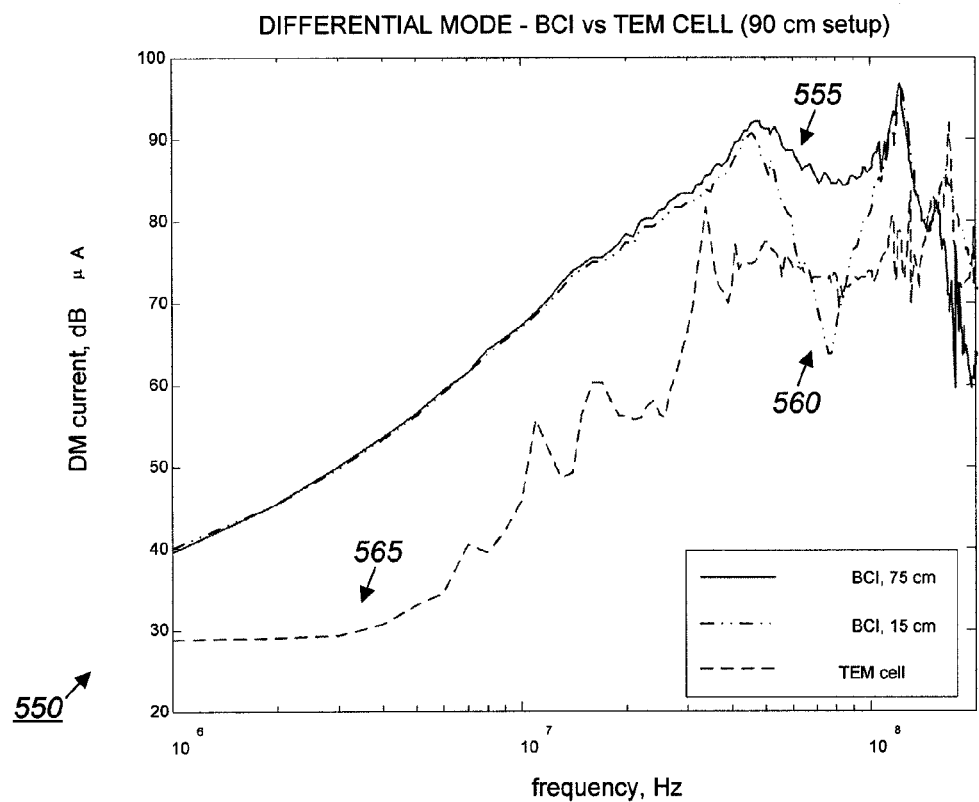
FIG. 8B is another exemplary plot of differential mode currents on a CAN bus, according to one embodiment of the invention.

In some embodiments, as described with respect to FIGS. 8A and 8B, the output signals from the testing apparatus 600 (shown in FIG. 6) and the testing apparatus 700 (shown in FIG. 7) can be compared. For example, the output signals from the testing apparatus 600 (with BCI device) effectively emulates a scenario in which an RF current is induced on the CAN bus due to impinging EMI in a frequency range of 1 MHz to 400 MHz. The output signals from the testing apparatus 700 (with TEM cell), alternatively, are the result of an intensity-static radiation technique (e.g., radiation of 200 V/m). Gathering multiple output signals with different testing apparatuses can aid in determining the precise level of RF current that should be applied when validating a CAN bus with a BCI device.

FIGS. 8A and 8B illustrate exemplary plots 500, 550 of common mode currents and differential mode currents, respectively, induced in a CAN bus and measured via an RF detection system and testing apparatus. For example, the common mode and differential mode current values included in the plots 500, 550 can be attained by testing a CAN bus with one of the previously described testing apparatuses (see FIGS. 6 and 7), and gathering the DC output data. In some embodiments, there is a log-linear relationship between the RF current induced on the CAN bus and the DC output signal (voltage). As shown in FIGS. 8A and 8B, the DC output signal, which has been scaled to dBμA, is plotted as a function of frequency. Such scaling may be required for a comparison of the DC output signal to an industry standard value.

To attain the DC output values shown in the plots 500, 550, RF power ($P^{dBm}$) is first determined using a conversion equation, as shown in equation (2) below:

$$V^{Vdc} = S(P^{dBm} - I) \quad (2)$$

where $V^{Vdc}$ is the output DC voltage in volts, $P^{dBm}$ is the RF current or power in dBm, S is the slope, and I is the intercept. The output DC voltage ($V^{Vdc}$) is determined using an output monitoring device (described above). The values for the slope S and the intercept I are dependent on the detection electronics being used in the testing apparatus, and the frequency of the signal being induced on the CAN bus. For example, the slope S can be computed at each testing frequency using equation (3) below:

$$S = 3.4 \times 10^{-6} \cdot R_{load} \chi \quad (3)$$

where $R_{load}$ is a resistance associated with the RF detection circuit and $\chi$ is a known frequency dependent correction factor. After computing the RF power ($P^{dBm}$) in dBm (equation 2 above), another transfer function can be used to convert the RF power ($P^{dBm}$) into output current ($I^{dB\mu A}$), as shown in equation (4) below:

$$I^{dB\mu A} = P^{dBm} + 107 + A - 34 \quad (4)$$

where the factor A accounts for 30 dB of attenuation (e.g., from an attenuator), and the constant −34 accounts for a 50 ohm load resistor from which the RF current is sampled or measured.

In the embodiment shown in FIGS. 8A and 8B, the plots 500 and 550 are scaled to the frequency dependent injection profile required by Standard DC-11224. The plot 500 illustrates common mode current 505, 510, 515 as measured by a testing apparatus having a BCI device positioned at 75 cm from a CAN bus termination node (see FIG. 6 for testing apparatus setup), a BCI device positioned at 15 cm from a CAN bus termination node (see FIG. 6 for testing apparatus setup), and a testing apparatus having a TEM cell (see FIG. 7 for testing apparatus setup), respectively. The plot 550 illustrates three differential mode currents 555, 560, 565 as measured using the same testing apparatus described with respect to FIG. 8A.

The BCI related data (505, 510, 555, 560) appear to have more severe fluctuations than the TEM cell related data (515, 565), especially for frequencies up to 100 MHz. The relatively large levels of common mode currents are due to the inherent function of a BCI device. For example, a BCI device, by its nature induces a common mode current in the CAN bus. The differential mode currents, alternatively, are largely influenced by the electromagnetic compatibility behavior of the CAN termination network. For example, the differential mode currents are typically affected by the ability of the CAN bus (and coupled components) to prevent conversion of noise from common mode currents to differential mode currents.

Various features and embodiments of the invention are set forth in the following claims.

The invention claimed is:

1. A device for measuring currents induced in a controller area network ("CAN") bus harness having a first termination node and a second termination node, the device comprising:
   a current separator circuit having a radio frequency ("RF") transformer configured to be connected to the first termination node of the bus harness, the RF transformer having a primary winding with a center tap and a secondary winding;
   a detection circuit connected to the current separator circuit, the detection circuit having a log-linear radio frequency/intermediate frequency ("RF/IF") integrated circuit;
   a power source circuit connected to the detection circuit;
   an electromagnetic shield enclosing the detection circuit and the power source circuit;
   a first load connected to the center tap; and
   a second load connected to the secondary,
   wherein the detection circuit is connected to the first load and to the second load, and is configured to measure both common-mode and differential-mode currents in the CAN bus harness.

2. The device of claim 1, wherein the first load is configured to match the impedance of the CAN bus harness.

3. The device of claim 1, wherein the second load is configured to match the impedance of the CAN bus harness.

4. The device of claim 1, wherein the electromagnetic shield is a metallic enclosure having an electromagnetic interference ("EMI") shielding connector for providing a connection between the detection circuit and a conductor.

5. The device of claim 1, wherein the detection circuit generates a DC output according to the measured common mode current and differential mode current in the CAN bus harness.

6. The device of claim 1, wherein the separator circuit has a bandwidth of 0.4 to 450 MHz.

7. The device of claim 1, wherein the power source circuit is configured to produce 4.5 volts DC.

8. A device for measuring currents induced in a controller area network ("CAN") bus harness having a first termination node and a second termination node, the device comprising:
- a current separator circuit having a radio frequency ("RF") transformer connected to the first termination node and configured to separate a common mode RF current and a differential mode RF current of an RF current signal;
- a detection circuit connected to the current separator circuit and configured to receive at least one of the common mode RF current and the differential mode RF current from the separator circuit, and to convert the common mode RF current and differential mode RF current to an non-RF output signal; and
- a power source circuit configured to provide power to the detection circuit.

9. The device of claim 8, wherein the detection circuit includes a log-linear radio frequency/intermediate frequency ("RF/IF") integrated circuit.

10. The device of claim 9, wherein the detection circuit includes discrete electronics configured to match the impedance of the integrated circuit.

11. The device of claim 9, wherein the detection circuit includes a first log-linear RF/IF integrated circuit and a second RF/IF integrated circuit, the first integrated circuit configured to convert the common mode RF current to a common mode output signal, and the second integrated circuit configured to convert the differential mode RF current to a differential mode signal.

12. The device of claim 8, further comprising an enclosure configured to house the detection circuit and the power source circuit, and to provide electromagnetic interference ("EMI") shielding.

13. The device of claim 8, further comprising an EMI shielding connector for providing a connection between the detection circuit and a conductor.

14. The device of claim 8, further comprising a first load coupled between the current separator circuit and the detection circuit, the first load configured to match the characteristic impedance of the CAN bus harness.

15. The device of claim 8, further comprising a second load coupled between the current separator circuit and the detection circuit, the second load configured to match the characteristic impedance of the CAN bus harness.

16. A method of measuring currents induced in a controller area network ("CAN") bus harness having a first termination node and a second termination node, the method comprising:
- inducing a radio frequency ("RF") current onto the CAN bus harness;
- coupling a separator circuit to the first termination node, the separator circuit configured to separate a common mode current and a differential mode current of the RF current;
- transmitting, by the separator circuit, at least one of the common mode current and the differential mode current to a RF detection device; and
- receiving, by the RF detection device, at least one of the common mode current and the differential mode current; and
- converting at least one of the common mode current and the differential mode current to an output signal.

17. The method of claim 16, further comprising transmitting the output signal to a display device.

18. The method of claim 16, further comprising filtering the output signal to avoid electromagnetic interference ("EMI").

19. The method of claim 16, further comprising varying the intensity of the RF current being induced on the CAN bus harness.

20. The method of claim 16, further comprising varying the frequency of the RF current being induced on the CAN bus harness.

* * * * *